（12） United States Patent
Bojkov et al.

(10) Patent No.: US 6,979,647 B2
(45) Date of Patent: Dec. 27, 2005

(54) METHOD FOR CHEMICAL ETCH CONTROL OF NOBLE METALS IN THE PRESENCE OF LESS NOBLE METALS

(75) Inventors: Christo P. Bojkov, Plano, TX (US); Diane L. Arbuthnot, Plano, TX (US); Robert F. Kunesh, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 140 days.

(21) Appl. No.: 10/653,548

(22) Filed: Sep. 2, 2003

(65) Prior Publication Data

US 2005/0048798 A1    Mar. 3, 2005

(51) Int. Cl.7 ............................................. H01L 21/44
(52) U.S. Cl. ..................... 438/687; 438/686; 438/597; 438/652
(58) Field of Search ................ 438/597, 652, 438/656, 685, 686, 687

(56) References Cited

U.S. PATENT DOCUMENTS

2003/0006062 A1 *  1/2003  Stone et al. ................ 174/255

* cited by examiner

Primary Examiner—Bradley K. Smith
(74) Attorney, Agent, or Firm—Yingsheng Tung; Wade James Brady, II; Frederick J. Telecky, Jr.

(57) ABSTRACT

A method for preparing a bonding pad on an integrated circuit wafer by the steps of depositing a conductive seed layer (104) on the bonding pad; depositing a metal layer (301, 302, and 303) over a portion of the conductive seed layer; and immersing the wafer in an etchant solution (501) to remove the portion of the seed layer not covered by the metal layer. The etchant solution contains a chelating agent that bonds ions from the seed layer. When the seed layer is copper or a refractory metal, and the metal layer is gold or palladium, the preferred chelating agent is selected from, but is not limited to, but is not limited to, the families of ethylenediaminetetraacetic acids (EDTA), 8-hydroxy-quinolines, including 8-hydroxy-quinoline-5-sulfonic acid, porphyrins, and phthalocyanines.

17 Claims, 4 Drawing Sheets

METHOD FOR CHEMICAL ETCH CONTROL OF NOBLE METALS IN THE PRESENCE OF LESS NOBLE METALS

FIELD OF THE INVENTION

The present invention is related in general to the field of metallurgical systems with application to electronic systems and semiconductor devices and more specifically to methods of preventing unwanted depositions of less noble metals on surfaces of more noble metal during chemical etching.

DESCRIPTION OF THE RELATED ART

It is a continuing trend in the semiconductor industry to miniaturize integrated circuits (ICs). As a consequence of this trend, the RC time constant of the interconnection between active circuit elements increasingly dominates the achievable IC speed-power product. Consequently, there is a strong need to replace the relatively high resistivity of the interconnecting aluminum metallization by the lower resistivity of metals such as copper.

For IC bond pads made of copper, the formation of thin copper(I)oxide films during the manufacturing process flow has to be prevented, since these films severely inhibit reliable attachment of bonding wires, especially for conventional gold-wire ball bonding. In contrast to aluminum oxide films overlying metallic aluminum, copper oxide films overlying metallic copper cannot easily be broken by a combination of thermocompression and ultrasonic energy applied in the bonding process. As further difficulty, bare copper bond pads are susceptible to corrosion.

In order to overcome these problems, several investigations aim at developing a process to cap the clean copper bond pad with one or more metal layers. So far, the process favored by the industry is based on forming a layer of aluminum over the copper bond pad and thus re-constructing the traditional situation of an aluminum pad to be bonded by conventional gold-wire ball bonding. This process, though, has a number of drawbacks due to technical and cost issues.

An alternative process is based on the concept of depositing a stack of layers on the copper, wherein the layer closest to the copper acts as a barrier to shield the copper from diffusing into other metals, and the outermost layer has to be bondable by the conventional gold ball of wire bonding. This process still needs the satisfactory solution of technical detail problems, foremost a practical approach to deposit and pattern the conductive metallization needed for plating processes.

An urgent need has therefore arisen for a metallurgical bond pad structure suitable for ICs having copper interconnection metallization which combines a low-cost method of fabricating the bond pad structure, a control of up-diffusion, and an avoidance of unwanted metallic contamination of the surfaces designated for bonding wires to these pads. The bond pad structure and the method of fabrication should be flexible enough to be applied for different IC product families and a wide spectrum of design and process variations. Preferably, these innovations should be accomplished while shortening production cycle time and increasing throughput, and without the need of expensive additional manufacturing equipment.

SUMMARY OF THE INVENTION

One embodiment of the invention is a method for the removal of a first metal from the presence of a second metal by placing the first and second metals in an oxidizing etchant solution containing a chelating agent, which selectively forms a complex with the first metal. When the first metal is copper and the second metal gold or palladium, the preferred chelating agent is selected from, but is not limited to, the families of ethylenediamine-tetraacetic acids (EDTA), 8-hydroxyquinolines, including 8-hydroxy-quinoline-5-sulfonic acid (HQS), porphyrins, and phthalocyanines.

Another embodiment of the invention is a method for preparing a bonding pad on an integrated circuit wafer by the steps of depositing a conductive seed layer on the bonding pad; depositing a metal layer over a portion of the conductive seed layer; and immersing the wafer in an etchant solution to remove the portion of the seed layer not covered by the metal layer, the etchant solution containing a chelating agent that bonds ions from the seed layer. When the seed layer is copper or a refractory metal, and the metal layer is gold or palladium, the preferred chelating agent is selected from, but is not limited to, but is not limited to, the families of ethylenediaminetetraacetic acids (EDTA), 8-hydroxyquinolines, including 8-hydroxy-quinoline-5-sulfonic acid (HQS), porphyrins, and phthalocyanines.

Embodiments of the present invention are related to wire-bonded IC assemblies, semiconductor device packages, surface mount and chip-scale packages. It is a technical advantage that the invention offers a methodology to smooth, stable interfaces of the gold wire ball and the modified bond pad, resulting in welds with strong metallic interdiffusion. Additional technical advantages include the opportunity to scale the assembly to smaller dimensions, supporting the ongoing trend of IC miniaturization; and the absence of unwanted metals, supporting high reliability of the finished IC assemblies.

The technical advantages represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIGS. 1 to 5B are schematic cross sections illustrating certain steps of the process flow for completing the fabrication of a bonding pad on an integrated circuit wafer.

FIG. 1 depicts the deposition of a metal layer needed for applying electrical potential in the plating process of a stack of interface layers over the wafer metallization.

FIG. 2 illustrates the forming of a patterned photoresist layer.

FIGS. 5A and 5B illustrate the immersion of the wafer in an electrolytic bath for etching the exposed metal layer portions.

FIG. 6 schematically represents the molecular structure of ethylenediamineetraacetic acid (EDTA).

FIG. 7 schematically represents the molecular structure of 8-hydroxyquinoline-5-sulfonic acid.

FIG. 8 schematically represents the molecular structure of porphyrin.

FIG. 9 schematically represents the molecular structure of phthalocyanine.

DETAILED DESCRIPTION OF THE PREFERRED EMBODIMENTS

The present invention is related to U.S. patent application Ser. No. 10/086,117, filed on Feb. 26, 2002 (Bojkov et al., "Waferlevel Method for Direct Bumping on Copper Pads in Integrated Circuits").

Figure 1:
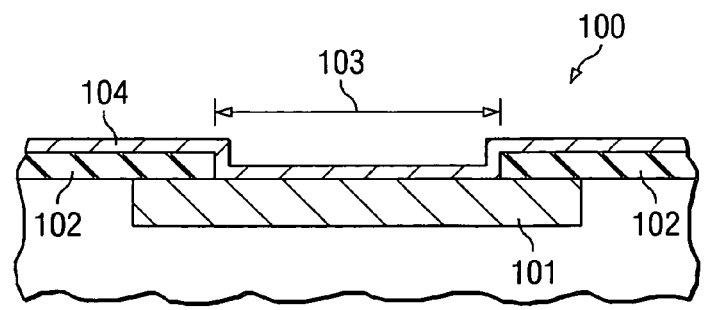

FIGS. 1 to 5B are schematic cross sections illustrating certain steps in the process flow for completing the fabrication of a bonding pad on an integrated circuit (IC) wafer. FIG. 1 shows schematically a portion of a semiconductor wafer, generally designated 100, having interconnections 101 and a protective overcoat 102. The semiconductor material is preferably silicon, but may alternatively be silicon germanium, gallium arsenide, or another III–V or II–IV semiconductor. The interconnection 101 is preferably copper; alternatively, aluminum or aluminum/copper alloy, or similar materials can be employed. The protective overcoat 102 is preferably silicon nitride, but may alternatively be silicon oxynitride, silicon carbide, silicon dioxide, or a polymer, for example. A window of width 103 in overcoat 102 exposes metallization 101 selectively.

The semiconductor wafer 100 including the protective overcoat 102 and the exposed metallization 101 is subjected to a series of cleaning and etching steps as follows: exposing the wafer to organic solvents, thereby removing organic contamination and mechanical particles from the copper contact pads; drying the wafer in dry nitrogen; exposing the wafer to an oxygen and nitrogen/helium/argon plasma, thereby ashing any further organic residues on the copper contact pads and oxidizing the copper surface to a controlled thickness; and, without breaking the vacuum of the plasma chamber, exposing the wafer to a hydrogen and nitrogen/helium/argon plasma, thereby removing the controlled copper oxide from the surface of the exposed copper metallization and passivating the cleaned surface, which is then sputter-etched with energetic ions so that a fresh and activated surface is created.

Without delay, a layer 104 of seed metal is then deposited to cover the fresh surface, preferably by a sputtering technique without breaking the chamber vacuum. The seed metal is preferably copper; other options include a refractory metal such as tantalum, titanium, tungsten, molybdenum, chromium, nickel, vanadium, or an alloy of any of these metals, or a layer stack of copper and any of the above metals or combinations. In some devices, gold is used as a seed metal layer. Layer 104 exhibits low electrical resistance and thermo-mechanical stress to the pad; it is, therefore, well suited for the following plating steps and to provide adhesion to the chip metallization 101 the protective overcoat 102.

Figure 2:
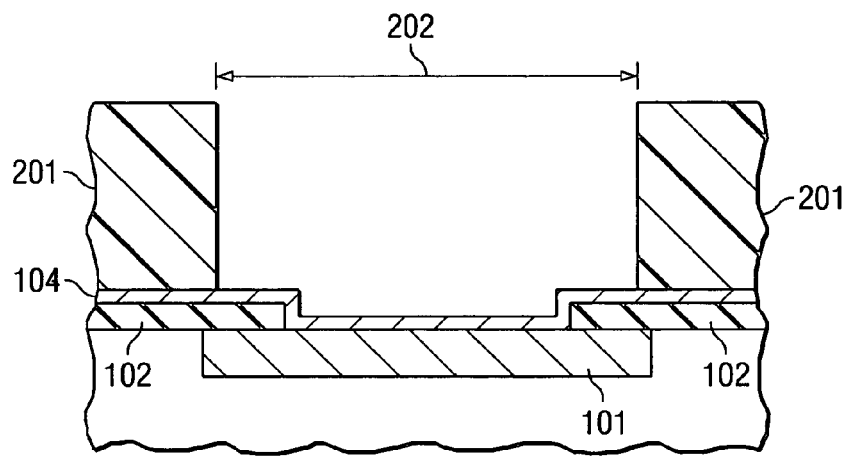

FIG. 2 illustrates the forming and patterning of a photoresist layer 201. The photoresist pattern defines the opening 202, which exposes the seed metal layer 104 over the interconnecting wafer metallization 101. The process flow continues with the step of exposing the seed metal layer 104 in the opening 202 to a hydrogen and nitrogen/argon plasma, which cleans and passivates the seed metal layer 104 in the photoresist opening 202.

Figure 3A:
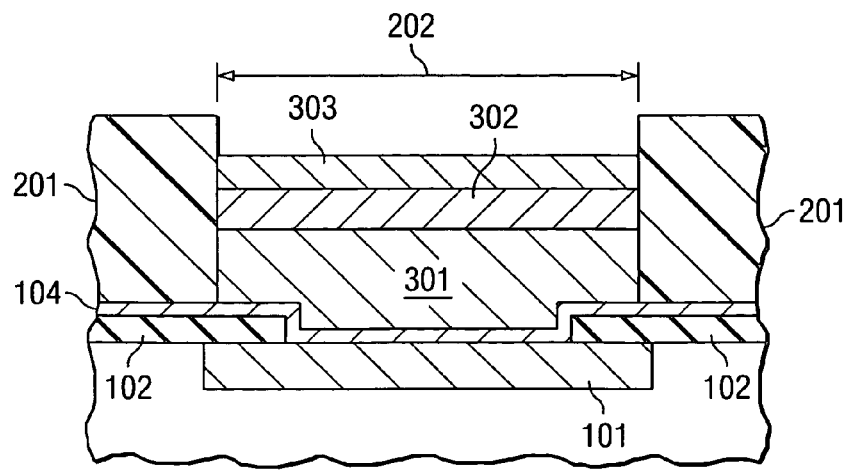
FIG. 3A shows the deposition of a stack of interface layers for one embodiment of the invention.
Figure 3B:
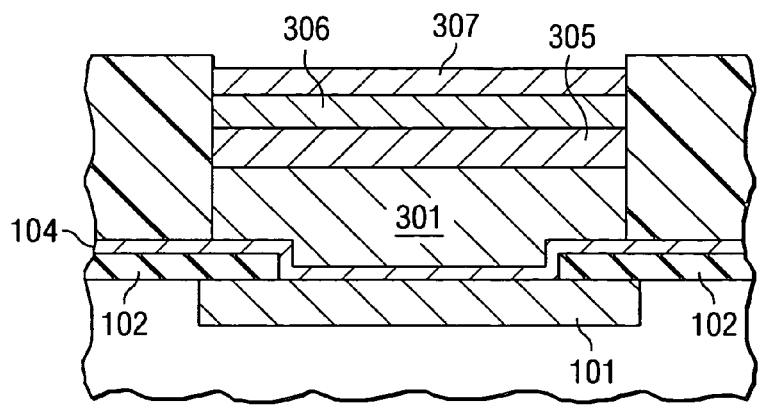
FIG. 3B shows the deposition of a stack of interface layers for another embodiment of the invention.

FIG. 3A illustrates the sequential deposition of interface layers for one embodiment of the invention, FIG. 3B shows the analogous deposition for another embodiment. In FIG. 3A, a copper stud 301 is deposited onto the seed metal layer 104 exposed in the photoresist opening 202. (As defined herein, the word "stud" is chosen because of the relative thickness of layer 301; preferably, stud 301 is between 1 and 20 $\mu$m thick). This deposition is executed without exposing the passivated seed metal layer 104 to fresh contamination, whereby two options are available: the preferred method is electrolytic plating; and another method is electroless plating.

Next, layer 302 is deposited over the copper stud 301, preferably by an electrolytic technique. Material and thickness of layer 302 are selected to let layer 302 act as a barrier layer that resists copper diffusion. The material of layer 302 is less noble than copper and is preferably nickel; other options include tin, lead, cobalt, iron, chromium, zinc, magnesium, aluminum, and alloys thereof. When nickel is selected, layer 302 has a preferred thickness range from 1 to 5 $\mu$m. (As commonly practiced, the term "more noble metal" or "less noble metal" refers to the relative position of that particular metal compared to another metal in the table of electrochemical potentials, in which all metals are rank-ordered for their ability to be oxidized; the lower a metal is ranked, the harder it is to be oxidized and thus the more "noble" it is).

Next, the outermost layer 303 is deposited over barrier layer 302, again preferably by an electrolytic technique. The surface of the outermost layer 303 is smooth; its average surface roughness is less than about 50 nm. The material of layer 303 is preferably more noble than the material of layer 302 and copper stud 301 and is selected so that it is wire bondable (ball, wedge, and ribbon bonding), meaning that a wire or ribbon will reliably adhere to the surface. Due to the surface smoothness of layer 303, wire bonding provides uniform metal interdiffusion and thus reliable welds. Preferably, layer 303 is made of palladium or gold; other options include silver, platinum, and alloys thereof. When gold is selected, layer 303 has a preferred thickness range from 50 and 250 nm; in some applications, gold layers up to 3 $\mu$m thickness are used. The preferred metal for the bonding wire is gold; other options include copper, aluminum, silver, and alloys thereof.

The embodiment of FIG. 3B shows two barrier layers 305 and 306, instead of only one barrier layer 302. First barrier layer 305, positioned directly on copper stud 301, resists copper diffusion, while second barrier layer 306, positioned on first barrier layer 305, resists the diffusion of the first barrier metal. The first barrier material is preferably nickel; other choices include tin, lead, cobalt, iron, chromium, zinc, magnesium, aluminum, and alloys thereof. For nickel, the preferred thickness range of layer 305 is between 1 and 5 $\mu$m. The second barrier material is preferably palladium; other options include cobalt, platinum and osmium. For palladium, the preferred thickness range of layer 306 is between 0.1 and 0.5 $\mu$m. The deposition method is preferably electrolytic plating.

The outermost layer 307 is deposited over barrier layer 306, preferably by electrolytic plating. The surface of the outermost layer 307 is smooth; its average surface roughness is less than about 50 nm. The material of layer 307 is preferably more noble than the material selected for layers 305 and 306 and copper stud 301, and is selected so that it is wire bondable (ball, wedge, and ribbon bonding) Due to the surface smoothness of layer 307, wire bonding provides uniform metal interdiffusion and thus reliable welds. Preferably, layer 307 is made of gold; other options include platinum, palladium, silver, and alloys thereof. The preferred metal for the bonding wire is gold; other options include copper, aluminum, silver, and alloys thereof.

Figure 4A:
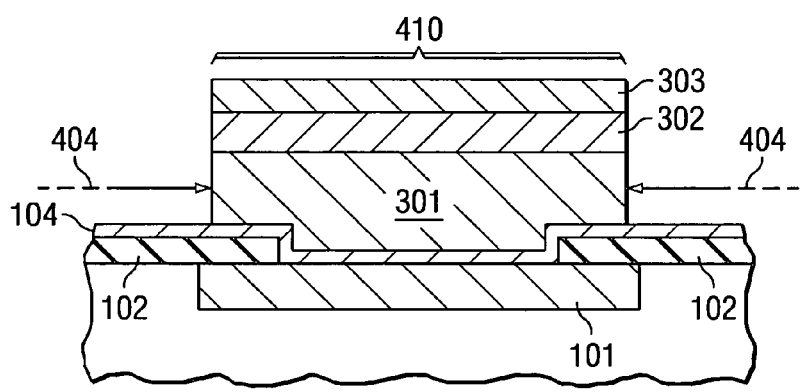
FIGS. 4A and 4B illustrate the removal of the patterned photoresist layer, exposing portions of the metal layer.
Figure 4B:
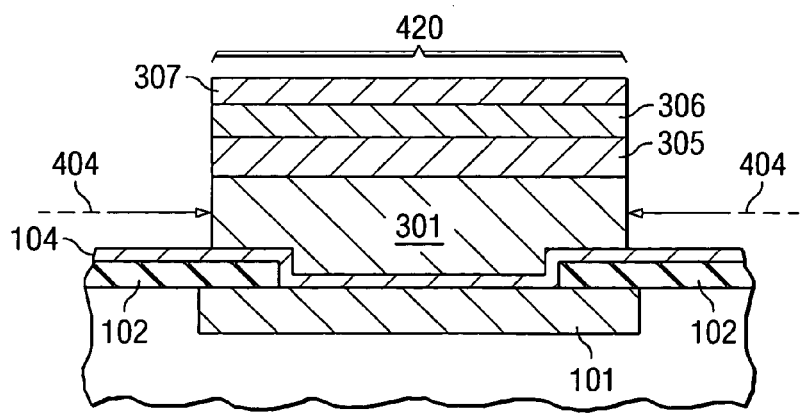

FIGS. 4A and 4B show the stripping of the photoresist material as the next step in the fabrication flow. As a consequence, seed metal layer 104 has all portions of lengths 404 exposed, which are outside the plated metal stack 410 and 420.

Figure 5A:
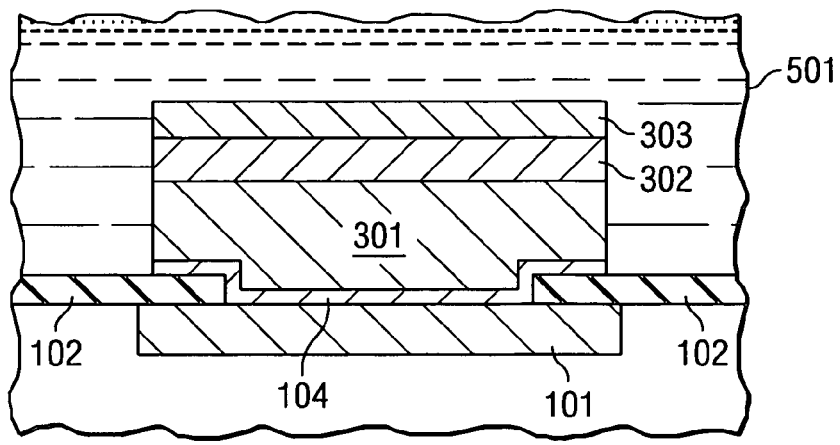
Figure 5B:
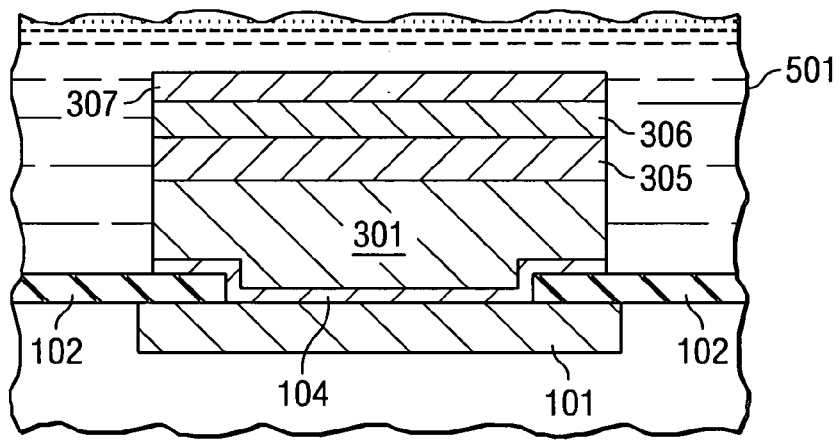

FIGS. 5A and 5B illustrate the removing of the exposed portions of seed metal layer 104. The wafers are immersed in an oxidizing etchant solution 501, which is usually a highly acidic bath based on $H_2SO_4$, $H_2O_2$, HCl, or related mixtures. In such a highly acidic environment, the etched copper and refractory metal of the exposed seed layer are chemically dissolved into the form of free ions such as $Cu^{++}$ or $Cu^+$. If these ions remain free, they may electro-deposit by reverse plating due to a galvanic potential onto the surface of other more noble metals that are in contact with the same acid solution. As FIGS. 5A and 5B show, such more noble metals in the same etch solution include layer 303 (preferably palladium) or layer 307 (preferably gold). It is, therefore, an advantage to remove these ions from the etch solutions.

According to the present invention, the preferred method is to add chelating agents to solution 501, which bind the seed ions into chemical complexes having a strong binding energy, or association constant. The selection criteria for the effectiveness of a proposed complexing agent is that the dissociation energy (the dissociation constant) of the complex should be higher than the energy of the galvanic couple formed by the etched and bound metal (for instance, copper) and the metal of the outermost layer (for instance, palladium). In such an arrangement, the galvanic voltage does thus not dissociate the complex (for instance, copper complex) in the wet etch bath. For an etch bath composed of $H_2O_2$ and $H_2SO_4$, the difference of the galvanic potentials of copper, nickel and palladium result in an electromotive force (EMF) of 0.8 V. A dissociation constant of the complex of $1 \cdot 10E-10$ gram-ions/liter, or less, should prevent the dissociation of the copper complexes under this EMF.

Dependent on the metals used in seed layer 104, one can select chelating agents specific for certain metals or metal families, or chelating agents which can bind with nearly any metal ions with different association constants. Most chelating agents contain one or more strongly electro-negative atoms such as oxygen, nitrogen, or sulfur. In a molecule, these atoms tend to be strongly polar and will have a slightly negative charge associated with them, which will pull positively charged metal ions to the molecule.

For the metals of copper, titanium and tungsten, which are preferably used in the seed layer 104, the following chelating agents are preferred, but it should be understood that this list is not exclusive.

Figure 6:
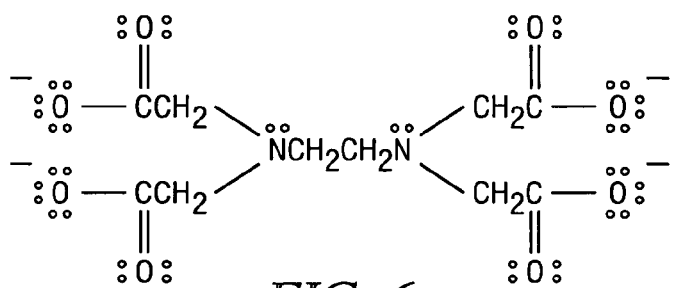
FIGS. 6 to 9 show the schematic structural formulas of examples of chelating agents having selective operations in electrolytic solutions.

Ethylenediaminetetraacetic acid (EDTA). EDTA is relatively nonspecific due to its six available binding sites (hexadentate ligand). The structure of EDTA is shown in FIG. 6. EDTA is available in several forms, or variations, which may improve the solubility in certain solvents, or may structure EDTA more specifically for certain metal ions. EDTA is commercially available from a number of chemical suppliers, for example Sigma Aldrich, USA.

Figure 7:
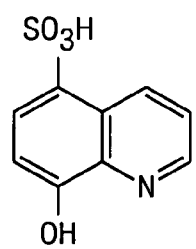

8-hydroxyquinoline, especially 8-hydroxyquinoline-5-sulfonic acid (HQS). In broad terms, the quinoline group, and also the relatively similar pyridine group, is a naphthaline molecule with a nitrogen in the ring system. Hydroxyquinolines can create a binding site by adding an oxygen atom near the nitrogen to form an electron-dense region. The molecular structure of 8-hydroxyquinoline-5-sulfonic acid is shown schematically in FIG. 7. This molecule is an effective chelating agent for copper; however, there are many variations of quinoline and hydroquinoline, which are able to serve as effective, reliable chelating agents for other metals-to-be-gettered. They are commercially available from chemical suppliers such as Sigma-Aldrich Corporation, USA.

Figure 8:
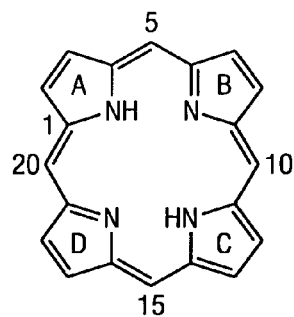

Porphyrin. This is a wide family of ligands with many suitable compounds. A deciding aspect of the most appropriate selection is good solubility of the porphyrin in the chosen etchant composition. The basic structure of porphyrin is depicted in FIG. 8. The structure is a large, circular, aromatic ring with nitrogens inside the ring to create a metal binding site, which binds the captured metal ion tightly and thus has a very strong association constant. In addition, since porphyrin is an aromatic structure, many compounds of this family are fluorescent; consequently, the metal ion compounds formed on binding can be detected and controlled by fluorescence or UV-visual spectroscopy. The porphyrin best suited for the chosen etchant solution may have to be synthesized on a customized basis, using as a criteria the metal-to-be-gettered. An example of a suitable commercial company is Frontier Scientific, U.S.A., which will synthesize custom compounds.

Figure 9:
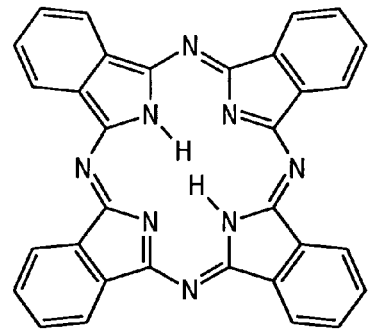

Phthalocyanine. The structure of phthalocyanine is schematically reproduced in FIG. 9. It includes additional nitrogen and a larger aromatic network compared to the structure of porphyrin as shown in FIG. 8. Phthalocyanine is a large, circular, aromatic ring structure; the nitrogens inside the ring create a metal binding site with a high association constant. For commercial availability check with Frontier Scientific (see above).

By incorporating a chelating agent in the etchant solution according to the embodiment of the invention described above, the problem of re-depositing copper or barrier metals on top of the outermost layer (303 in FIG. 3A, and 307 in FIG. 3B) can be avoided. It has been demonstrated for the example of copper that without the presence of chelating agents, the re-deposition can result in a 10 to 30% elemental copper film deposited on the outermost layer. This copper has a tendency to oxidize and prevent successful wire bonding onto the outermost layer. If ion bombardment is used for removing the unwanted copper, the outermost layer is severely roughened, which again makes wire bonding more difficult.

Figure 10A:
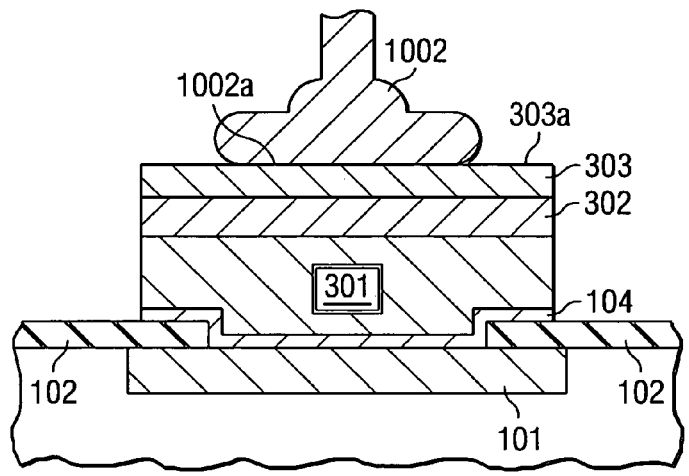
FIG. 10A is a schematic cross section of a metal wire connected to a bond pad positioned on an integrated circuit according to an embodiment of the invention.

Another embodiment of the invention (see FIG. 10A) is a structure for metallurgical connections between metal wires 1001 and bond pads positioned on integrated circuits having interconnecting metallization 101 made of copper, aluminum, or aluminum alloy. The structure comprises a bond pad surface of non-oxidized copper stud 301; a layer of barrier metal 302 that resists copper diffusion deposited on the copper surface, the barrier metal being less noble than copper; an outermost layer 303 of metal more noble than the barrier metal, the surface of the outermost layer having an average surface roughness of less than about 50 nm; and a metal wire 1001 bonded to the outermost metal layer. FIG. 10A illustrates schematically the structure of this embodiment. A metal wire 1001, preferably gold, is bonded to the outermost metal layer 303. As stated earlier, the surface 303a of the outermost layer has a roughness of less than about 50 nm, based on the process method of the invention, so that the interface 1001a of wire ball-to-layer-surface is smooth, providing a uniform metal interdiffusion at the interface 1001a and thus a reliable weld.

Figure 10B:
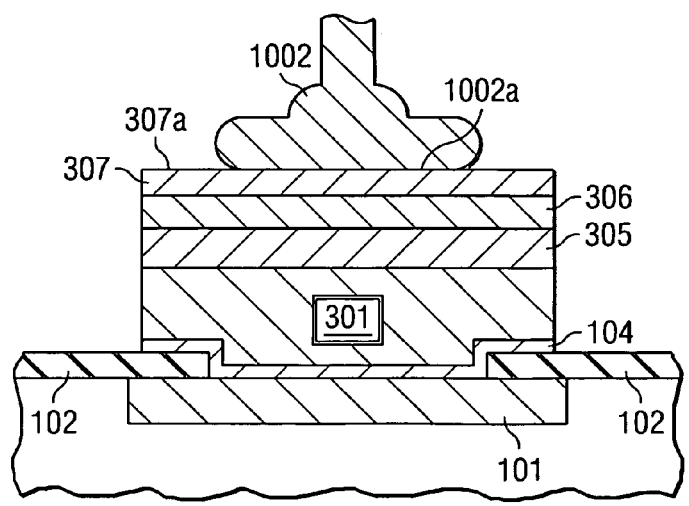
FIG. 10B is a schematic cross section of a metal wire connected to a bond pad positioned on an integrated circuit according to another embodiment of the invention.

Yet another embodiment of the invention (see FIG. 10B) is a structure for metallurgical connections between metal wires 1002 and bond pads positioned on integrated circuits having interconnecting metallization 101 made of copper, aluminum, or aluminum alloy. The structure comprises a bond pad surface of non-oxidized copper stud 301; a layer 305 of first barrier metal that resists copper diffusion deposited on the copper surface, the barrier metal being less noble than copper; a layer 306 of second barrier metal on the layer of first barrier metal, the second barrier metal being more noble than the first barrier metal and resisting diffusion of the first barrier metal; an outermost layer 307 of metal more noble than both barrier metals, the surface of the outermost having a surface roughness of less than about 50 nm; and a metal wire 1002 bonded to the outermost metal layer. FIG. 10B illustrates schematically the structure of this embodiment. A metal wire 1002, preferably gold, is bonded to the outermost metal layer 307. As stated earlier, the surface 307a of the outermost layer has a roughness of less than about 50 nm, based on the process method of the invention, so that the interface 1002a of wire ball-to-layer-surface is smooth, providing a uniform metal interdiffusion at the interface 1001a and thus a reliable weld.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, an embodiment of the invention is a method for electrolytic removal of a second metal from a substrate while preventing the unwanted deposition of this metal on a first metal. The method comprises the step of exposing the substrate to an electrolytic solution containing a chelating agent, which selectively forms a complex with the second metal. An illustrating example is the corrosion-protective coating of metal parts, which are exposed to the environment, such as bumpers and wheel caps in the automotive industry.

It is therefore intended that the appended claims encompass any such modifications and embodiments.

We claim:

1. A method for the removal of a first metal from the presence of a second noble metal, comprising the step of:
   providing a layer of the first metal;
   providing a layer of the second noble metal having a top surface, partially covering the layer of the first metal;
   exposing the uncovered first metal layer and the top surface of the second metals in an oxidizing etchant solution containing sulfuric acid and hydrogen peroxide and a chelating agent, said chelating agent selectively forming a complex with the first metal.

2. The method according to claim 1 wherein said first metal is copper.

3. The method according to claim 1, wherein said second noble metal is gold.

4. The method according to claim 1 wherein said second noble metal is palladium.

5. The method according to claim 1 wherein said chelating agent is selected from a group consisting of the families of ethylenediaminetetraacetic acids (EDTA), 8-hydroxyquinolines, including 8-hydroxy-quinoline-5-sulfonic acid (HQS), porphyrins, and phthalocyanines.

6. A method for making a wire-bond, comprising the steps of:
   depositing a conductive seed layer on a bonding pad on a wafer;
   depositing a noble metal layer covering a portion of said conductive seed layer;
   immersing said wafer in an etchant solution containing sulfuric acid and hydrogen peroxide, exposing the surface of the noble metal layer and the uncovered portion of the seed layer to remove the portion of said seed layer not covered by said metal layer, said etchant solution containing a chelating agent that bonds ions from said seed layer; and
   wire-bonding a wire to the exposed surface of the noble metal layer at the bonding pad.

7. The method according to claim 6 wherein said conductive seed layer is copper.

8. The method according to claim 6 wherein said conductive seed layer is a refractory metal including titanium, tungsten, tantalum, nickel, vanadium, or an alloy thereof.

9. The method according to claim 6 wherein said noble metal layer is gold.

10. The method according to claim 6 wherein said noble metal layer is palladium.

11. The method according to claim 6 wherein said chelating agent is selected from a group consisting of the families of ethylenediaminetetraacetic acids (EDTA), 8-hydroxyquinolines, including 8-hydroxy-quinoline-5-sulfonic acid (HQS), porphyrins, and phthalocyanines.

12. A method for preparing a bonding pad on an integrated circuit wafer, comprising the steps of:
    depositing a conductive seed layer containing copper on said bonding pad;
    depositing a metal layer covering a portion of said conductive seed layer, said metal layer comprising a metal more noble than copper; and
    immersing said wafer in an etchant solution containing sulfuric acid and hydrogen peroxide, exposing the uncovered portion of the seed layer to remove the portion of said seed layer not covered by said noble metal layer, said etchant solution containing a chelating agent that binds copper ions from said seed layer, whereby redeposition of said copper ions on said metal layer is avoided.

13. The method according to claim 12, wherein said conductive seed layer is copper.

14. The method according to claim 12 wherein said conductive seed layer is a refractory metal including titanium, tungsten, tantalum, nickel, vanadium, or an alloy thereof.

15. The method according to claim 12, wherein said noble metal layer is made of gold.

16. The method according to claim 12, wherein said noble metal layer is made of palladium.

17. The method according to claim 12, wherein said chelating agent is selected from a group consisting of the families of ethylenediaminetetraacetic acids (EDTA), 8-hydroxyquinolines, including 8-hydroxy-quinoline-5-sulfonic acid (HQS), porphyrins, and phthalocyanines.

* * * * *